US 6,573,538 B2

(12) United States Patent
Motsiff et al.

(10) Patent No.: US 6,573,538 B2
(45) Date of Patent: *Jun. 3, 2003

(54) SEMICONDUCTOR DEVICE WITH INTERNAL HEAT DISSIPATION

(75) Inventors: William T. Motsiff, Essex Junction, VT (US); Michael J. Shapiro, Austin, TX (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/191,721

(22) Filed: Nov. 12, 1998

(65) Prior Publication Data

US 2002/0024132 A1 Feb. 28, 2002

(51) Int. Cl.[7] ................................................. H01L 23/48
(52) U.S. Cl. ................... 257/127; 257/707; 257/720; 257/722

(58) Field of Search ........................... 257/706, 707, 257/712, 713, 720, 722, 127

(56) References Cited

U.S. PATENT DOCUMENTS

| 5,360,988 A | * | 11/1994 | Uda et al. ............... 257/529 |
| 5,442,236 A | | 8/1995 | Fukazawa |
| 5,446,311 A | | 8/1995 | Ewen et al. |
| 5,491,352 A | | 2/1996 | Tsuji |
| 5,559,367 A | | 9/1996 | Cohen et al. |
| 5,621,616 A | | 4/1997 | Owens et al. |
| 5,625,232 A | | 4/1997 | Numata et al. |
| 5,675,187 A | | 10/1997 | Numata et al. |
| 5,757,080 A | * | 5/1998 | Sota ........................ 257/777 |
| 5,859,465 A | * | 1/1999 | Spring et al. ........... 257/484 |
| 5,994,762 A | * | 11/1999 | Suwanai et al. ........ 257/620 |
| 6,066,884 A | * | 5/2000 | Krutsick ................. 257/484 |
| 6,100,589 A | * | 8/2000 | Tanaka ................... 257/758 |
| 6,137,155 A | * | 10/2000 | Seshan et al. .......... 257/640 |

* cited by examiner

Primary Examiner—Jerome Jackson
Assistant Examiner—Lourdes Cruz

(57) ABSTRACT

A thermal management system for a semiconductor chip including at least one region of thermally conductive material included internally within the semiconductor chip.

12 Claims, 5 Drawing Sheets

SEMICONDUCTOR DEVICE WITH INTERNAL HEAT DISSIPATION

FIELD OF THE INVENTION

The invention relates to the field of semiconductor devices. More particularly, the invention relates to heat dissipation structures for incorporation into the internal structure of a semiconductor chip.

BACKGROUND OF THE INVENTION

The generation of heat by electric structures is well known. Even desktop computers have fans for helping to draw cooling air through the housing containing the computer. Heat can degrade performance and damage electronic devices in a number of ways.

Typically, heat produced in a semiconductor device simply flows out through materials utilized to form the basic wiring structure within the semiconductor device. Often, no special structures are provided to help dissipate heat within the semiconductor devices. However, to cope with ever increasing amounts of heat being generated by ever increasing performance of semiconductor devices has created a challenge of trying to dissipate this heat. A number of approaches are utilized, including attaching semiconductor chips to heat sinks and even incorporating fans into chip supports. These structures providing this method for dissipating heat in a semiconductor device make work as long as excessive heat does not build up in a semiconductor device.

Heat dissipation problems are increased by the introduction of low dielectric constant materials in place of materials such as $SiO_2$ typically used. Such materials have been and are being introduced to increase the speed of wiring levels in semiconductor chips. Most of these low dielectric constant materials have poor thermal conductivity. Furthermore, these low dielectric constant materials actually make up a large volume of semiconductor chips. As a result, heat dissipation out of semiconductor chips is further limited by these new low dielectric constant materials. Such materials provide another motivation for increasing heat transfer through a chip and heat dissipation from a chip.

Low dielectric constant, low thermal conductivity materials can reduce the amount of heat flowing through and consequently out of semiconductor chips. As a result, utilization of these materials could be limited. Therefore, the benefits of these materials may not be widely available.

SUMMARY OF THE INVENTION

The present invention solves problems of heat dissipation through and from semiconductor devices by providing new heat dissipation pathways through a semiconductor device.

In accordance with these and other objects and advantages, aspects of the present invention provide a thermal management system for a semiconductor chip. The thermal management system includes at least one region of thermally conductive material within the semiconductor chip.

Additionally aspects of the present invention provide a semiconductor chip that includes a substrate, at least one layer including electrically insulating material on the substrate, at least one layer including electrically conducting material on the substrate, and at least one region of thermally conductive material included internally within the semiconductor chip.

Further aspects of the present invention provide a method for producing a thermal management system for a semiconductor chip. The method includes providing a substrate. Regions of electrically conducting material and regions of electrically insulating material are provided on the substrate. At least one region of thermally conductive material is provided internally within the semiconductor chip.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

As stated above, the present invention provides a thermal management system for semiconductor chips. The present invention may be utilized in all semiconductor chips. However, the present invention is particularly useful for using semiconductor chips that include low dielectric constant materials. Such materials typically have a dielectric constant of from about 3.6 to about 2.0.

A thermal management system according to the present invention may include at least one structure internal to the chip to assist in transfer of heat from the interior of the chip toward the exterior surfaces of the chip where the heat may then be dissipated to the surrounding environment. In the context of the present invention, "internal to the chip" may include structures on the surfaces of the chip.

Therefore, the thermal management system according to the present invention includes at least one region of thermally conductive material within a semiconductor chip. The at least one region of thermally conductive material may be located anywhere within the chip. It may also take a variety of forms.

According to one example of the present invention, the at least one region of thermally conductive material contacts at least a portion of a guard ring that is included internally within the semiconductor chip. Guard rings are described in more detail in U.S. Pat. No. 5,757,080, the entire contents of the disclosure of which is hereby incorporated by reference. The guard ring may help to protect the structures formed within the area of the guard ring from moisture and/or gases, among other functions.

Figure 3:
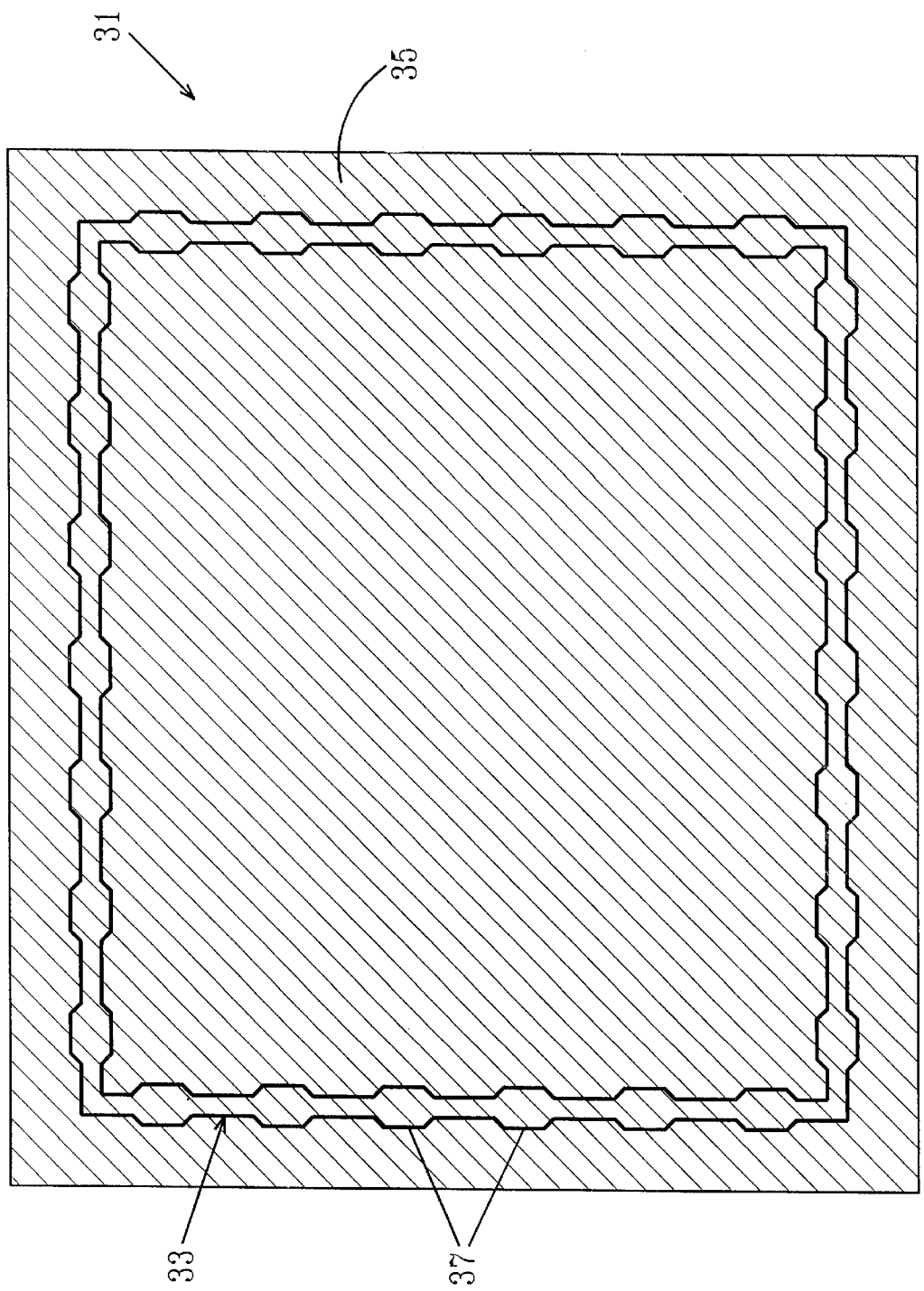
FIG. 3 represents a top view of another embodiment of a thermal management system according to the present invention.

As illustrated in FIG. 3, a guard ring may be located about the perimeter of a semiconductor chip, although internal to the chip. Typically, the guard ring extends entirely around the semiconductor chip. However, the guard ring may extend only partially around the semiconductor chip. In some cases, while the guard ring may extend entirely around the chip, some openings may be provided in the guard ring. Additionally, the guard ring may extend entirely from the top surface, or in the vicinity of the top surface, of the semiconductor chip down to contact the surface of the substrate that the chip is formed on.

Guard rings may be made of a variety of materials. Any material that may provide the desired function of the guard ring may be utilized. According to one example, a guard ring may be made of electrically conducting material. For example, a guard ring may be made of metal. Examples of metals that may be used in a guard ring include any one or more of Al, Cu, W, Au, and alloys thereof. Typically, a guard ring is made of the same material as the wiring in the chip.

The dimensions of a guard ring may vary, depending upon the embodiment. The size of the chip may be one factor that determines the dimensions of the guard ring. According to one example, the guard ring has a thickness of about 1 $\mu$m to about 100 $\mu$m.

Figure 1:
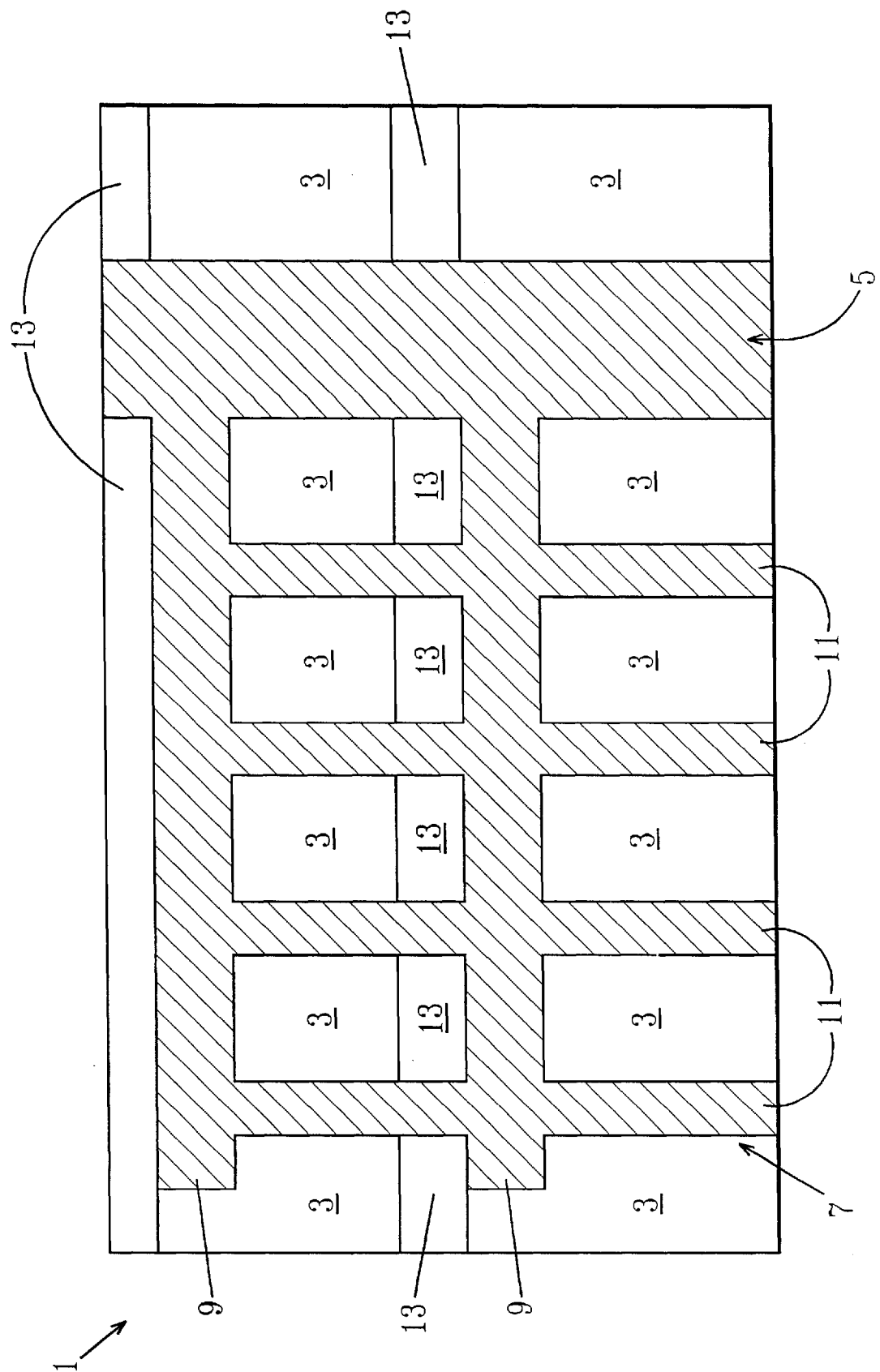
FIG. 1 represents a cross-sectional view of an embodiment of a thermal management system for a semiconductor chip according to the present invention.

According to an embodiment where the thermally conductive material contacts the guard ring, to assist in transferring heat out of the structure of the semiconductor chip, as stated above, the at least one region of thermally conductive material may contact at least a portion of the guard ring. FIG. 1 illustrates a cross-sectional view an example of a structure according to this embodiment of the present invention. Accordingly, FIG. 1 illustrates a portion of a semiconductor chip 1. The portion of the semiconductor chip illustrated in FIG. 1 includes regions of a dielectric material 3. The dielectric could be one of the low dielectric constant materials mentioned above.

FIG. 1 also illustrates a portion of the guard ring 5. The thermal management system illustrated in FIG. 1 includes fins 7 that contact portions of the guard ring 5. The fins 7 in the embodiment illustrated in FIG. 1 are arranged both horizontally 9 and vertically 11. The extent of the thermal management structures according to the present invention in planes on opposite sides of the cross section illustrated in FIG. 1 may vary, depending upon the embodiment. One factor that may determine the dimensions of the thermal management structures of the present invention is the free space in the semiconductor device not occupied by wiring or other structures. Thermal management structures according to the present invention may occupy any amount of such free space. According to one embodiment, the amount of space and, hence, the dimensions of thermal management structures according to the present invention may vary, depending upon the amount of heat that it is desired the structures absorb.

As can be appreciated from a review of the structure illustrated in FIG. 1, the thermal management system illustrated in FIG. 1 helps to dissipate heat in both horizontal and vertical directions from the interior of the chip to the guard ring, where it may subsequently be transferred from the guard ring out to the surrounding environment or to structures attached to the guard ring.

Both the guard ring and the fins illustrated in FIG. 1 may be made of copper. Thermal management structures according to the present invention may also be made of Cu, Au, W, alloys of these metals, or any other suitable material. Typically, thermal management structures according to the present invention are made of the same material that the wiring structures within a semiconductor are made of. Typically, the fins have dimensions sufficient to permit an amount of heat to be transferred out of the chip to maintain the chip at a temperature to prevent damage to the chip from the heat and to avoid impairing operation of the chip as a result of excessive heat build up in the chip.

FIG. 1 also illustrates an additional aspect of the present invention. According to this additional aspect, the present invention may include high thermal conductivity material 13 arranged in portions of the semiconductor chip. Typically, the high thermal conductivity material is an electrical insulator. However, if not connected to any active wiring structures, the high thermal conductivity material could be an electrical conductor. The fins described herein could be made of the high thermal conductivity material.

It is not necessary that the high thermal conductivity material be connected to the guard ring or the fins of thermally conductive material illustrated in FIG. 1. Similarly, it is not necessary that the fins 7 illustrated in FIG. 1 necessarily be connected to the guard ring. The thermal management structures according to the present invention could contact any one or more of the substrate that the semiconductor device is formed on, a guard ring, and/or dummy C4 connections. The fins and/or the high thermal conductivity material may be arranged such that they help to transfer heat from the interior of the semiconductor chip toward the periphery of the semiconductor chip. In some embodiments, the high thermal conductivity material is provided in wiring layers of the chip.

By high thermal conductivity material, the present invention includes materials having thermal conductances of about 1 w/cm·K, such as for the diamond-like material discussed herein, to about 68 w/cm·K, for copper metal.

Of course, one difference between a fin such as that illustrated in FIG. 1 and/or a line of high thermal conductivity electrically insulating material as compared to an electrically conducting material is that while the electrical insulator may contact electrically conducting structures, if the thermal management structure(s) are made of an electrically conducting material such as copper, they typically do not contact other electrically conducting structures in the semiconductor chip so as to avoid possible shorts. Along these lines, while other electrically conducting structures may be active and functional, typically, thermal management structures according to the present invention typically are inactive and not connected to any power source or any structure that would make them functional and conductive. Such structures may be referred to as "dummy" structures.

In accordance with the above, as illustrated in FIG. 1, structures made of a high thermal conductivity insulator may, of course, contact the fins made of electrically conducting material. Of course, electrically insulating materials may be utilized in the fins rather than electrically conducting materials.

Figure 2:
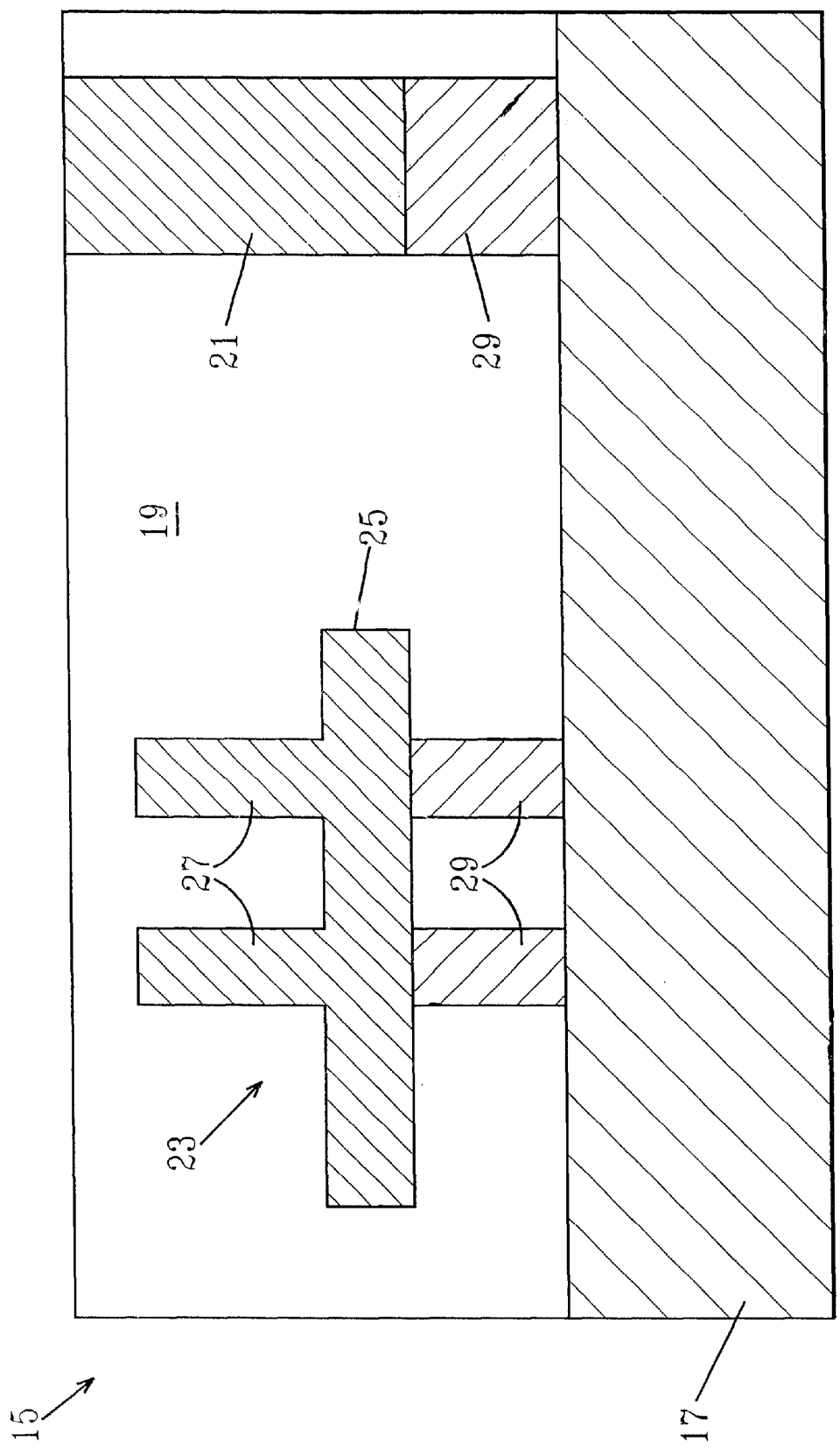
FIG. 2 represents a cross-sectional view of another embodiment of a thermal management system according to the present invention.

FIG. 2 illustrates another embodiment of the present invention. As such, FIG. 2 illustrates a cross-sectional view of a portion of a semiconductor chip 15. The section illustrated in FIG. 2 includes a portion of the substrate 17. The substrate 17 may be any typical semiconductor substrate, such as monocrystalline silicon. An electrical insulator 19 is arranged on the substrate.

Fins 23, including horizontally arranged fins 25 and vertically arranged fins 27, have been formed in the electrically insulating region 19. The fins 23 may be made up of copper, or any other electrically conducting or electrically insulating material. In the embodiment illustrated in FIG. 2, the fins 23 are connected to the substrate 17 by contacts 29.

Contacts 29 may be made up of any thermally conducting material. According to one example of the structure illustrated in FIG. 2, contacts 29 are made of tungsten. Examples of other materials that the contacts may be made of include TiN and/or TaN.

FIG. 2 also illustrates a portion of guard ring 21. In the embodiment illustrated in FIG. 2, fins 23 do not contact guard ring 21. However, guard ring 21 is also connected to the substrate with contact 29. The material utilized to make up the contact connecting the guard ring 21 to the substrate 17 may be any of the materials utilized to form the contacts connecting the fins 23 to the substrate 17.

FIG. 3 illustrates a top view of an upper surface 35 of a semiconductor chip 31 that includes a guard ring 33. As can be seen in FIG. 3, the guard ring may extend all the way to the top surface 35 of semiconductor chip 31. In order to facilitate transfer of heat out of the semiconductor chip 31, the guard ring may be connected to another structure by a controlled collapse chip connection (C4). FIG. 3 illustrates a plurality of C4 connections 37 arranged about the guard ring. Where fins internal to the semiconductor chip are connected to the guard ring, the present invention may include at least one C4 connection. The C4 connection may be attached to any structure such as a lead frame chip carrier, and/or heat sink that the semiconductor chip is to be attached to.

Figure 4:
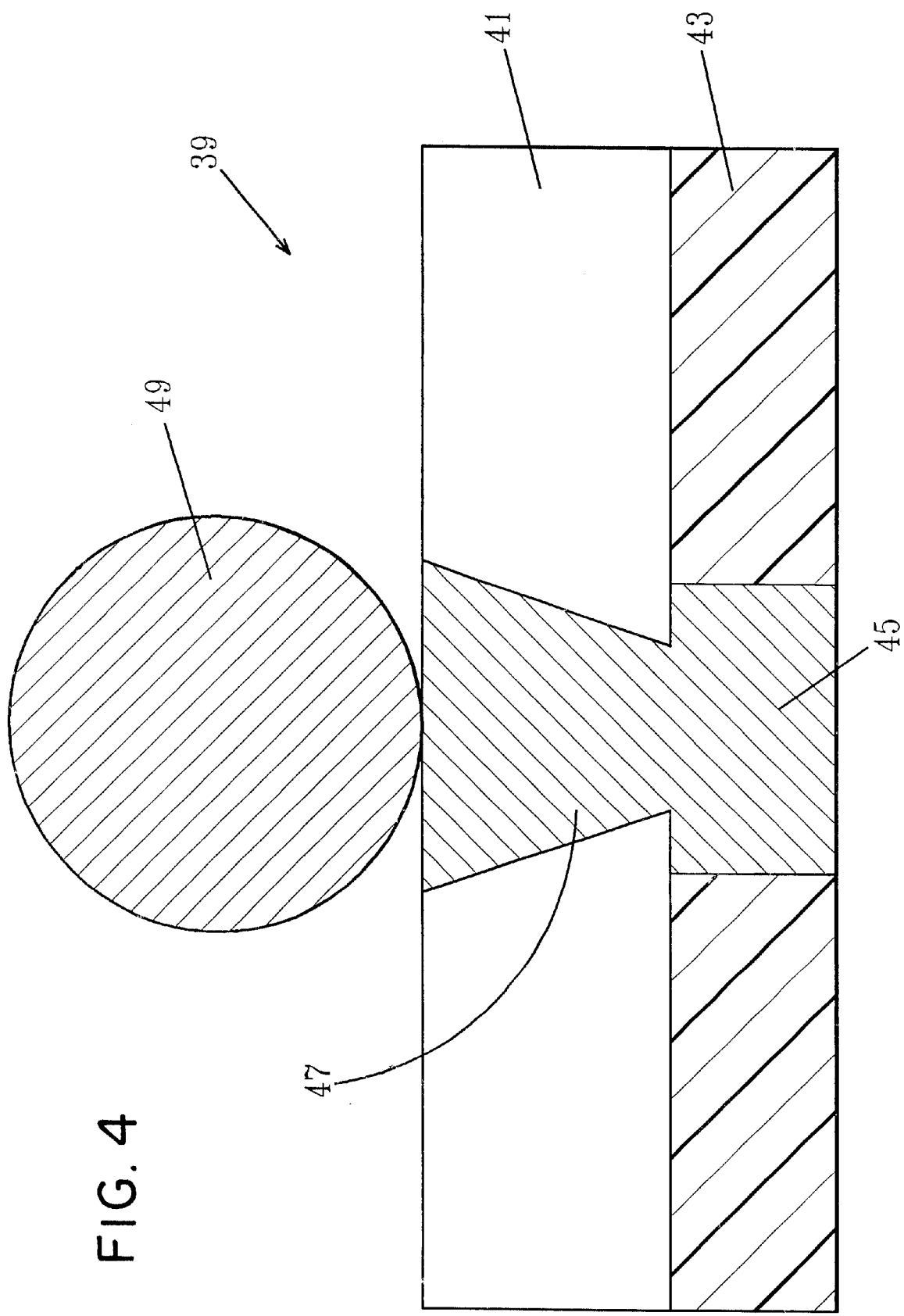
FIG. 4 represents a cross-sectional view of one aspect of an embodiment of a thermal management system according to the present invention.

FIG. 4 illustrates a cross-sectional view of a portion of a semiconductor chip 39 showing one C4 connection for connecting the guard ring to another structure. The portion of the chip illustrated in FIG. 4 includes a final passivation layer 41 on an insulating layer 43. The top portion of the guard ring 45 is illustrated extending through the insulator layer 43. A via 47 provides a connection between the top of the guard ring 45 and the solder ball 49 of the C4 connection.

Utilizing fins connected to the guard ring and C4 connections may require extra C4 connections utilizing dummy pads for wetting. The extra C4 connections may require extra room.

As stated above, the present invention may include any arrangement of heat conducting structures, such as fins, lines, vias, among others, so as to accomplish the goal of transferring heat from the interior of a semiconductor chip toward the periphery of the semiconductor chip. Along these lines, the structure according to the present invention may be connected to the underlying substrate upon which the chip is formed to transfer heat into the substrate as well. This may be accomplished by the contacts such as those described above and illustrated in FIG. 2. Connection of the fins to the guard ring and the guard ring to the underlying substrate may also provide a thermal conduction path.

According to one embodiment, the present invention includes dummy wiring lines and/or dummy vias. In other words, the at least one region of thermally conducting material may be provided in non-functional lines and/or vias to transfer heat toward the periphery of a chip where it may be dissipated from the chip. Such dummy lines and/or vias are not connected to any active structure. Any dummy structure may be connected to a fin, the substrate, and/or guard ring.

Figure 5:
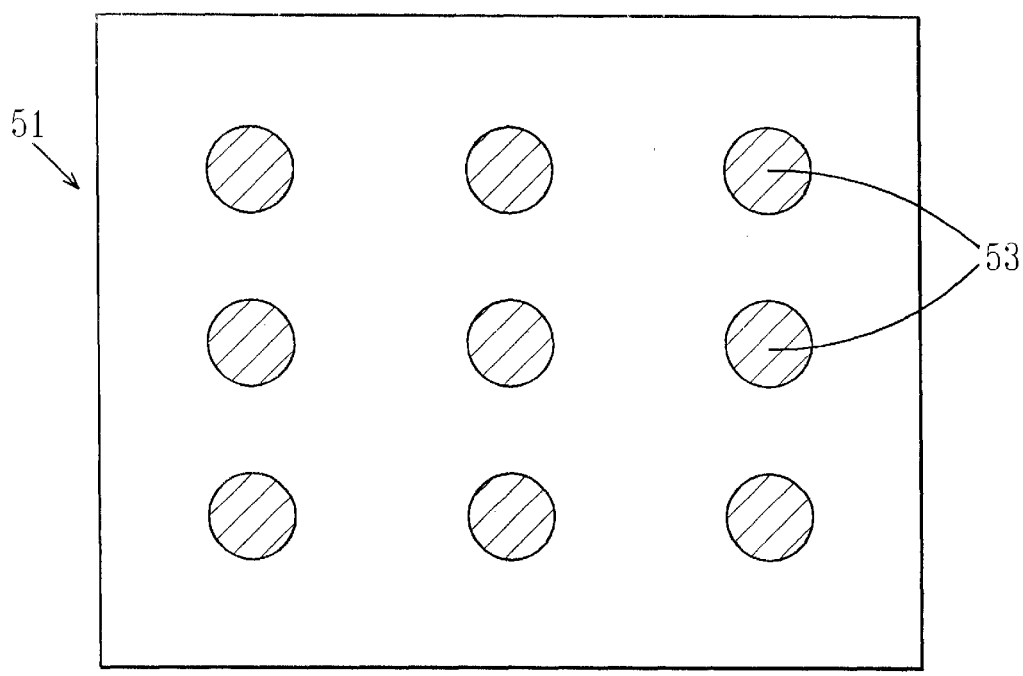
FIG. 5 represents a top view of a thermal management system according to the present invention.
Figure 6:
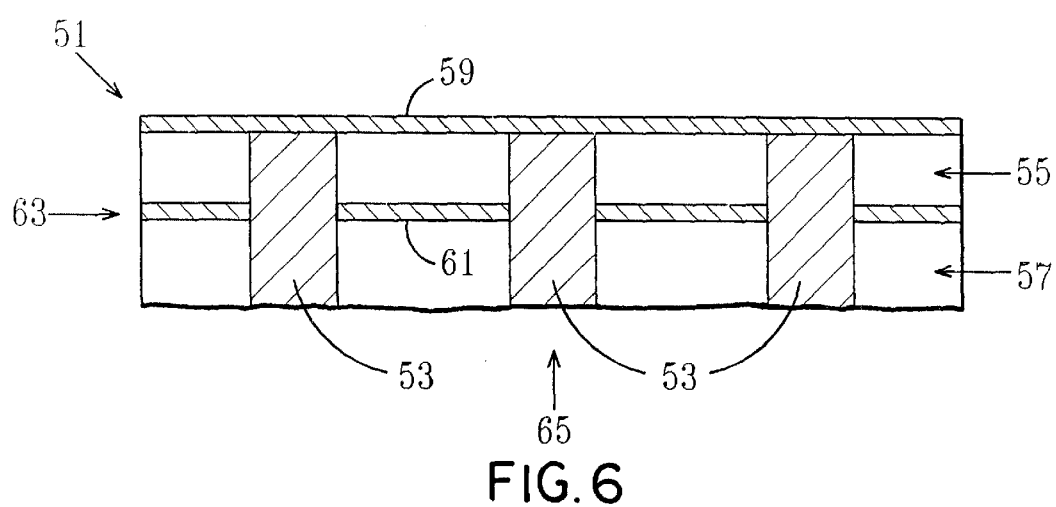
FIG. 6 represents a cross-sectional view of yet another embodiment of a thermal management system according to the present invention.
Figure 7:
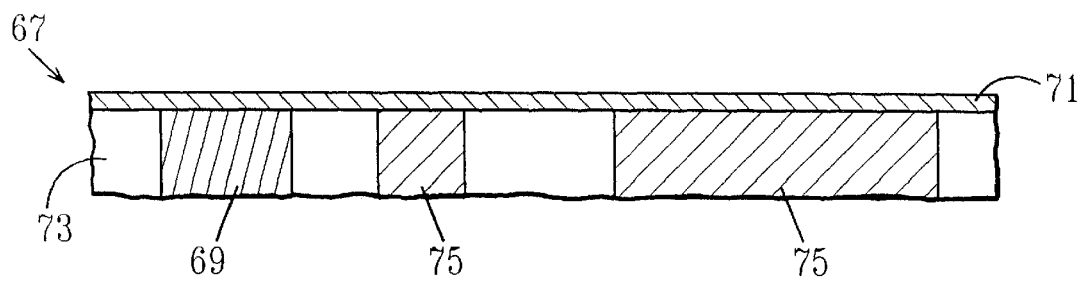
FIG. 7 represents a cross sectional view of yet a further embodiment of a thermal management system according to the present invention.

FIGS. 5–7 illustrate additional embodiments of the present invention. For example, FIG. 5 illustrates a portion of a semiconductor chip 51 that includes dummy vias 53. The dummy vias may be made of any of the materials described above for the fins of thermally conducting material. Along these lines, the dummy vias could be made of copper. Heat may be transmitted through the dummy vias out of the chip or to the underlying substrate. To facilitate conduction of heat out of the chip, dummy lines may be connected to the dummy vias.

FIG. 6 illustrates a cross-sectional view of the structure illustrated in FIG. 5. In addition to including dummy vias, the embodiment shown in FIG. 6 includes layers of low dielectric constant material 55 and 57, although any dielectric may be utilized. FIG. 6 also illustrates layers 59 and 61 of high thermal conductivity dielectric material. The layers of high thermal conductivity dielectric material may be arranged on the layers 55 and 57 of low dielectric constant material.

The structure illustrated in FIG. 6 may also or alternatively include at least one fin of thermally conducting material in place of or in addition to layers 59 and 61 of high thermal conductivity insulator. By providing vias 53, fins, and/or layers 59 and/or 61, a thermal management system according to the present invention may provide for heat flow in a direction a horizontal directions indicated by arrow 63 in FIG. 6 as well as heat flow in a vertical direction indicated by arrow 65 in FIG. 6.

FIG. 7 illustrates a cross-sectional view of a portion of a semiconductor chip 67. The structure illustrated in FIG. 7 includes a dummy via 69, a high thermal conductivity layer 71. The via is arranged in the high thermal conductivity layer arranged on a layer of 73 of a low dielectric constant material. FIG. 7 also illustrates a functional metal line 75.

One example of a high thermal conductivity material that may be utilized in layers, such as layers 71, 61 and 59 illustrated in FIGS. 6 and 7, is a diamond or diamond-like carbon film. For further information regarding this material, reference is made to U.S. Pat. No. 5,559,367 to Cohen et al., the entire contents of the disclosure which is hereby incorporated by reference. This high thermal conductivity material may also be utilized in dummy vias, wiring lines and/or fins as described above. If the high thermal conductivity material or the material is provided over a metal wire, the material may be patterned to permit connection to the other line metal wire but may be continuous elsewhere.

One advantage of the present invention is that the structures described above may be defined by normal chip processing. Along these lines, if a damascene process sequence, and particularly a dual damascene process sequence, is utilized, no extra processing may be utilized when forming structures according to the present invention. Additionally, at the extra dummy vias according to the present invention may help to maintain pattern density equal across an entire chip. This may, in turn, help to improve chemical mechanical polishing (CMP) uniformity.

The present invention also includes a semiconductor chip that includes a thermal management system described above. Additionally, the present invention includes an electronic package wherein a semiconductor chip including a thermal management system described above is attached to another structure such as a lead frame, chip carrier, heat sink, or other structure.

Still further, the present invention includes a method for producing a semiconductor chip. The method includes providing a substrate. Regions of electrically conducting electrically insulating material are provided on the substrate according to typical methods for fabricating semiconductor chips. These structures are along the lines of typical structures included in semiconductor chips and as such are not described further herein.

A guard ring may be provided on the substrate and through at least a portion of the regions of electrically insulating and/or electrically conducting material. The guard ring may be arranged in the vicinity of the perimeter of the semiconductor chip and at least partially surrounds the semiconductor chip and at least partially extends between the top surface of the semiconductor chip and the underlying substrate.

The method includes providing a thermal management structure that includes at least one region of thermally conductive material. Standard photolithographic processes may be utilized to define the at least one region of thermally conductive material. The at least one region of thermally conductive material may contact at least a portion of the guard ring, at least a portion of the underlying substrate, a wiring structure within the semiconductor device, and/or a dummy C4 connection. The method may also include providing C4 connections to the guard ring and/or any fins, vias, lines, or other structures made of the thermally conducting material.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A thermal management system for a semiconductor chip, comprising:

a thermally conductive guard ring provided at and below a surface of the semiconductor chip; and At least one region of thermally conductive material provided at and below a surface of the semiconductor chip and contacting at least a portion of the guard ring, the thermally conductive material having a thermal conductance of at least 1 w/cm·K and being electrically insulating.

2. The thermal management system according to claim 1, wherein the at least one region of thermally conductive material includes at least one thermally conductive fin.

3. The thermal management system according to claim 1, wherein the at least one region of thermally conductive material includes an electrically conductive material that is non-functional.

4. The thermal management system according to claim 1, wherein the at least one region of thermally conductive material contacts a controlled collapse chip connection for attaching the chip to another structure.

5. The thermal management system according to claim 1, wherein the thermally conductive material is arranged in wiring levels of the semiconductor chip.

6. The thermal management system according to claim 5, wherein the thermally conductive material contacts a functional electrically conductive material provided within the semiconductor chip, a portion of the functional electrically conductive material being exposed outside the semiconductor chip to permit electrical connection.

7. The thermal management system according to claim 1, wherein the thermally conductive material is arranged in one of a horizontal or vertical direction.

8. The thermal management system according to claim 7, wherein the thermally conductive material is arranged in one of a via or a portion of a plane of the semiconductor chip.

9. The thermal management system according to claim 1, wherein the thermally conductive material provides a plurality of pathways for heat dissipation from the semiconductor chip.

10. The thermal management system according to claim 1, wherein the thermally conductive material contacts an underlying substrate.

11. The thermal management system according to claim 1, wherein at least a portion of the thermally conductive material is arranged at the surface of the semiconductor chip.

12. A semiconductor device, comprising:

a semiconductor chip;

at least one electrically insulating material layer provided on the semiconductor chip;

at least one electrically conducting material layer provided on the semiconductor chip;

a thermally conductive guard ring provided at and below a surface of the semiconductor chip; and at least one region of thermally conductive material provided at and below the surface of the semiconductor chip, wherein the at least one region of thermally conductive material contacts a portion of the guard ring, has a thermal conductance of at least 1 w/cm·K, and is electrically insulating.

* * * * *